United States Patent [19]

Noji et al.

[11] Patent Number: 4,494,095

[45] Date of Patent: Jan. 15, 1985

[54] HIGH FREQUENCY CIRCUIT SHIELDING STRUCTURE HAVING TUNING COILS DOUBLE SHIELDED

[75] Inventors: Tasuku Noji, Soma; Torao Hiyama, Haramachi, both of Japan

[73] Assignee: Alps Electric Co., Ltd., Tokyo, Japan

[21] Appl. No.: 430,981

[22] Filed: Sep. 30, 1982

[30] Foreign Application Priority Data

Nov. 20, 1981 [JP] Japan .................................. 56/186422

[51] Int. Cl.³ ........................... H04B 1/08; H05K 5/04
[52] U.S. Cl. .................................. 334/85; 174/35 R; 455/347; 455/349; 361/424; 361/399
[58] Field of Search .......... 334/85; 174/35 R, 35 GC; 361/424, 403, 399; 455/347, 349; 336/84 R, 84 C

[56] References Cited

U.S. PATENT DOCUMENTS

| | | | |
|---|---|---|---|
| 2,828,413 | 3/1956 | Bowers | 455/349 X |
| 3,624,515 | 11/1971 | Rezek et al. | 334/85 X |
| 3,644,848 | 2/1972 | Kruczek | 455/349 X |
| 3,846,734 | 11/1974 | Pauza et al. | 361/403 X |
| 4,370,515 | 1/1983 | Donaldson | 174/35 R |
| 4,370,700 | 1/1983 | Duddles et al. | 174/35 R |

Primary Examiner—Paul Gensler
Assistant Examiner—Benny Lee
Attorney, Agent, or Firm—Guy W. Shoup; Gerard F. Dunne

[57] ABSTRACT

An assembly structure of a high frequency circuit apparatus including at least one first high frequency circuit block; a metallic chassis on which said first high frequency circuit block is disposed; a second high frequency block formed by placing a high frequency circuit element inside a metallic case having one of its surfaces opened; and a shield case having one of its surfaces opened and divided into compartments by shield plates shielding said high frequency circuit blocks from one another; said second high frequency circuit block being fitted to said metallic chassis in such a fashion that the open surface thereof is sealed by said metallic chassis; said shield case being fitted to said metallic chassis in such a fashion that said compartments thereof separate said high frequency circuit blocks from one another.

7 Claims, 13 Drawing Figures

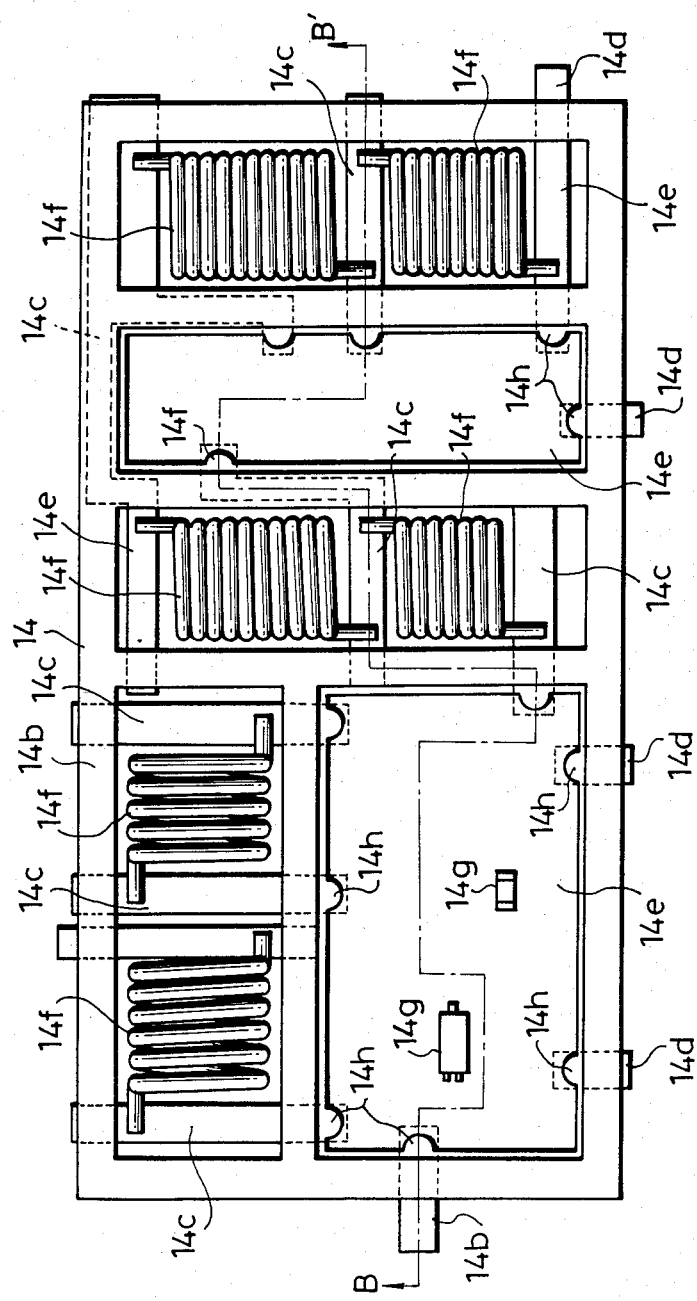

HIGH FREQUENCY CIRCUIT SHIELDING STRUCTURE HAVING TUNING COILS DOUBLE SHIELDED

BACKGROUND OF THE INVENTION

This invention relates to an assembly structure for a high frequency circuit apparatus. More specifically, the present invention relates to an assembly structure suitable for use in assembling a high frequency circuit apparatus such as a UHF circuit apparatus.

A high frequency apparatus such as a converter for converting a wave of a UHF band to a VHF band, for example, consists of a plurality of high frequency circuit blocks. The high frequency apparatus generally has a box-like metallic casing, which is divided by shield plates into a plurality of compartments corresponding to the high frequency circuit blocks. The high frequency apparatus is assembled by the steps of first fitting the high frequency circuit blocks, each consisting of high frequency circuit components such as resistors, transistors and the like wired in a predetermined arrangement, into the corresponding compartments, then connecting electrically the circuit blocks by terminals extending through the shield plates or connecting them electrically with external apparatus by terminals extending through an external frame of the shield case. Finally, a metallic cover is fitted to the shield case. Incidentally, inductance coils are often soldered directly to terminals disposed inside the compartments without using a circuit board in order to prevent the drop of Q. On the other hand, a circuit board for other components may be fitted to the shield case by soldering it to the terminals penetrating through the external frame of the shield case or through the shield plate, or to the terminals implanted in the bottom plate of the shield case. Still, alternatively, the circuit board may be directly screwed to the shield case.

In accordance with the conventional assembly structure of the high frequency apparatus such as the converter or the like described above, the terminals and the screw portions must be disposed inside the shield case in order to fix the circuit board and the coils in position, the result being a complicated construction and an increase in the number of components to be assembled. Moreover, the assembly work is extremely troublesome and complicated because the assembly of the circuit board and coils and connections between circuit boards must be carried out inside the compartments of the shield case. Still another drawback is that the adjustment of each high frequency circuit component is not easy. Among other drawbacks, the helical coil can be fitted only manually but can not be fitted automatically in place because of its shape. Furthermore, since the shield between the high frequency circuit blocks is made only by one shield plate, that is, since the apparatus has a single shield structure, the shield effect is not sufficiently high, especially for the helical resonator for which high stability operation is a requisite.

SUMMARY OF THE INVENTION

It is therefore an object of the present invention to provide an assembly structure for a high frequency circuit apparatus which is simple in construction and easy to assemble.

It is another object of the present invention to provide an assembly structure for a high frequency circuit apparatus which can provide a double shield effect.

These and other objects, features and advantages of the present invention will become more apparent from the following description when taken with the accompanying drawings.

BRIEF DESCRIPTION OF THE DRAWINGS

FIG. 6 is a plan view of the high frequency circuit block, which shows the state in which various electric components are placed on a mold frame;

DESCRIPTION OF THE PREFERRED EMBODIMENTS

Figure 1:
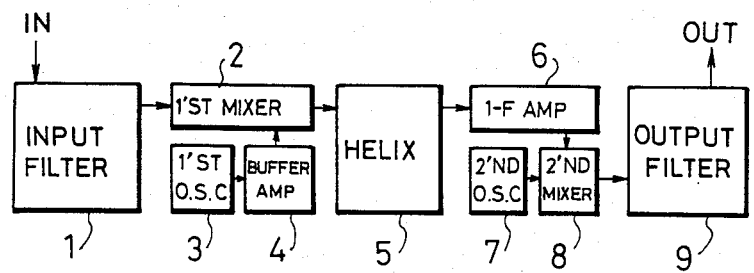
FIG. 1 is a block diagram of a CATV converter.

A CATV converter is one of the examples of a UHF band high frequency circuit which can be fitted within the structure of the present invention. FIG. 1 is a block diagram of such a CATV converter. The CATV converter selects only a signal of a desired channel from the UHF signals applied thereto, and converts the signal to an intermediate frequency (IF) signal. The converter has a double converter construction including a first mixer 2 and a second mixer 8, and operates in the following manner. First, the UHF signal is applied to an input terminal IN and unnecessary signals are removed from the input signal by an input filter 1. After being filtered, the input signal is applied to the first mixer 2. On the other hand, a first local oscillator 3 generates a local oscillation signal of a frequency corresponding to the selected channel and this local oscillation signal is amplified by a buffer amplifier 4 and is then applied to the first mixer 2. The first mixer 2 converts the input signal of the desired channel to the first IF signal. The resulting first IF signal passes through an IF filter 5 formed by a helical coil, is then amplified by an IF amplifier 6 of the subsequent stage and is thereafter applied to the second mixer 8. At the same time, the second local oscillator 7 converts the first IF signal and applies a local oscillation signal having an inherent frequency to the second mixer 8 in order to convert the IF signal to a signal equal to an empty channel of a TV, for instance. Thus, the second IF signal generated by the second mixer 8 passes through an output filter 9 of the subsequent stage, is converted to the empty channel signal alone and is produced from the output terminal.

Figure 2:
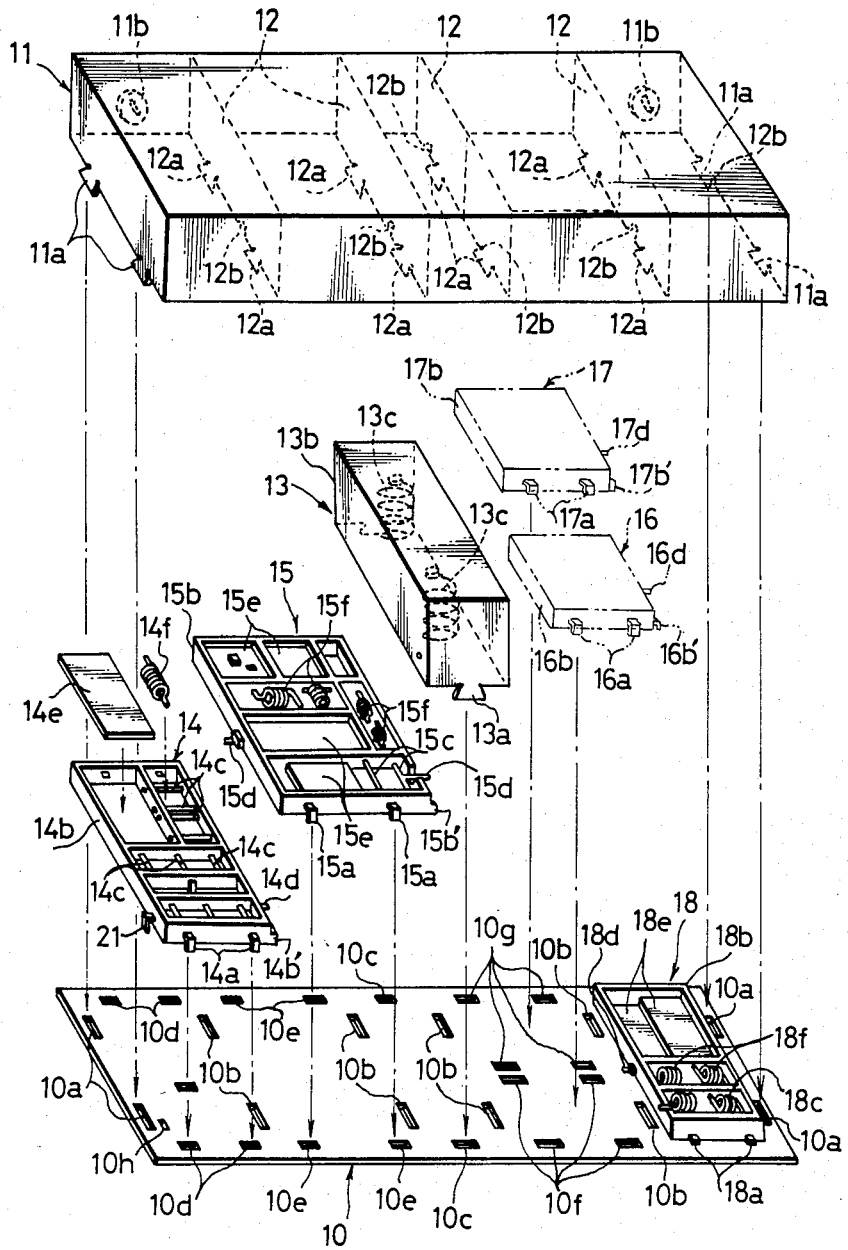
FIG. 2 is an exploded perspective view which is useful for explaining the assembly structure for the high frequency circuit in accordance with the present invention.

FIG. 2 is an exploded perspective view which is useful for explaining the assembly structure for the CATV converter described above. In the drawing, reference numeral 10 represents the bottom plate which is made of a metal sheet and functions as a metallic chassis. Holes 10a–10g are bored on the bottom plate 10, and caulking pawls 11a of a metallic frame 11, caulking pawls 12a of shield plates 12, caulking pawls 13a of the high frequency resonance circuit block 13 and caulking pawls 14a–18a of the high frequency circuit blocks 14–18 are fitted within these holes.

The metallic frame 11 has a box-like shape and serves as the shield case. One surface, i.e. the lower surface in the drawing, of this frame is open and shield plates 12 divide the frame into a plurality of compartments shielded from one another. Connectors 11b are fixed to the internal wall of the frame. The high frequency resonance circuit block 13 is formed by placing a high frequency circuit element such as a helical coil 13c, for example, in a box-shaped metallic case 13b whose one surface, i.e. the lower surface in the drawing, is open. Reference numerals 14 through 18 represent other high frequency circuit blocks. Connector plates 14c, 15c, 18c and connection terminals 14d, 15d, 16d, 17d and 18d are fixed to the mold frames 14b through 18b of these circuit blocks 14–18, respectively. Printed circuit boards 14e, 15e and 18e consisting of a ceramic sheet or the like and coils 14f, 15f and 18f are placed into respective divided compartments.

Incidentally, the high frequency resonance circuit block 13 corresponds to the IF signal filter 5 shown in FIG. 1 and the high frequency circuit block 14 does to the input filter 1. The high frequency circuit block 15 corresponds to the first mixer 2, the first local oscillator 3 and the buffer amplifier 4, and the high frequency circuit block 16 corresponds to the second local oscillator 7 and the second mixer 8. The high frequency circuit block 17 corresponds to the IF amplifier 6 and the high frequency circuit block 18 corresponds to the output filter 9.

The high frequency circuit apparatus such as the CATV described above is assembled in the following way. First, the caulking pawls 14a–18a of the high frequency circuit blocks 14–18 are fitted into the corresponding holes 10d–10g of the bottom plate 10 and are then caulked, thereby fixing the high frequency circuit blocks 14–18 to the bottom plate 10. Next, the caulking pawl 13a is fitted into and fixed to the hole 10c in such a fashion that the open surface of the metallic case 13b forming the high frequency resonance block 13 opposes the bottom plate 10, that is, in such a fashion that the open surface is sealed by the bottom plate 10. The high frequency circuit blocks are then connected electrically with one another. Finally, the caulking pawls 11a and 12a of the frame 11 and shield plate 12 are fitted into the corresponding holes 10a and 10b of the bottom plate 10 and are then caulked, thus completing the assembly of the high frequency circuit apparatus.

Figure 3:
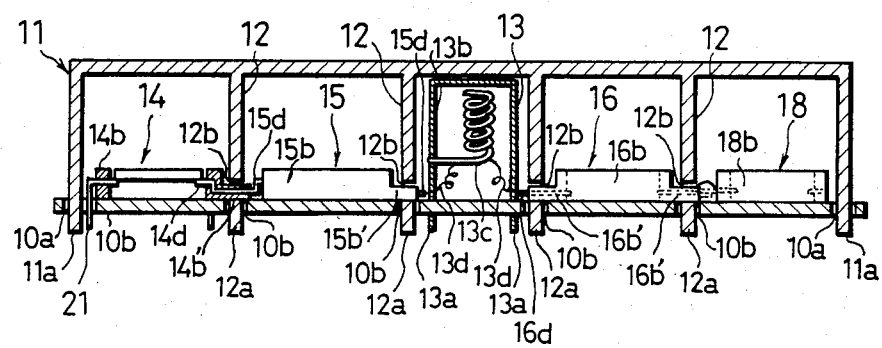
FIG. 3 is a sectional view of the assembly structure of the present invention.

FIG. 3 is a sectional view of the high frequency circuit apparatus assembled in the manner described above and FIG. 4 is a partially enlarged sectional view of the apparatus. The mold frames 14b, 15b, 16b, 18b of the high frequency circuit blocks 14, 15, 16, 18 are formed by molding a synthetic resin or the like and projecting portions 14b', 15b', 16b' are integrally formed at the output portions of the mold frames 14b, 15b, 16b. Connection terminals 14d, 15d, 16b formed of respective metallic plates are embedded into these projecting portions 14b', 15b', 16b' to enable the high frequency circuit blocks to be connected electrically with one another, and then project outward from the respective portions.

The high frequency circuit blocks are placed on the bottom plate 10 so that their projecting portions 14b', 15b', 16b' align with recessed openings 12b that are formed on the lower side of the shield plate 12. The frame 11 is then placed over the circuit blocks. Each circuit block such as the block 14, for example, is fitted to the bottom plate 10 so that the connection terminal 14d projecting outward from its projecting portion 14b' of the mold frame 14b comes into contact with the connection terminal 15d that projects outward from the mold frame 15b of the high frequency circuit block 15 adjacent the circuit block 14. The contact between the connection terminal 14d and the connection terminal 15d is fixed by solder 19 (see FIG. 4).

Reference numeral 21 represents a ground terminal of the high frequency circuit block 14 which is embedded into the mold frame 14b and is curved downward outside the mold frame 14b. The ground terminal 21 is fitted into the hole 10h bored in the bottom plate 10 and its lower end portion is fixed to the bottom plate 10 by solder 20. Similarly, the high frequency circuit blocks 16 and 17 and the high frequency circuit blocks 17 and 18 are electrically connected with one another in substantially the same way. The electric connection between the high frequency circuit block 15 and the high frequency resonance circuit block 13, and between the high frequency circuit block 16 and the high frequency resonance block 13 is established by connecting the helical coils 13c, 13c of the high frequency resonance circuit block 13 to the connection terminals 15d, 16d of the high frequency circuit blocks 15, 16 by a lead wire 13d.

Figure 4:
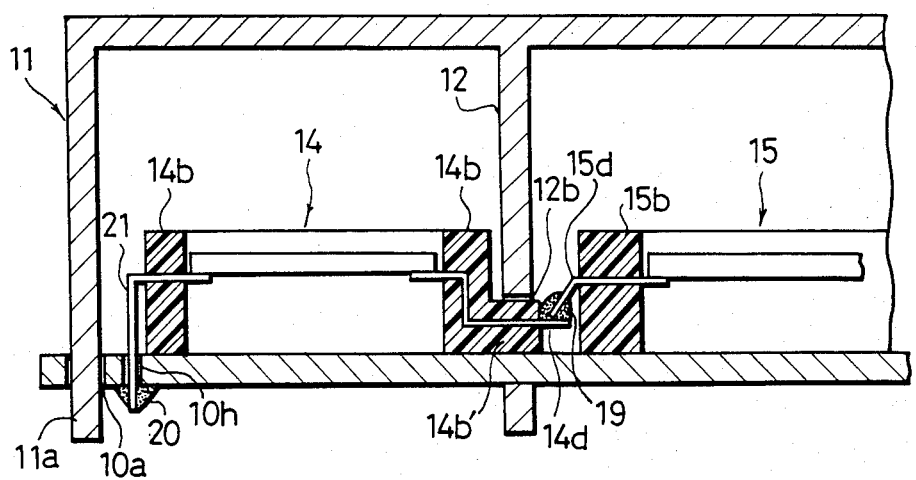
FIG. 4 is a partial sectional view thereof which shows in detail the connection between the circuit blocks.

Next, the method of embedding and fixing the connection plate 14c and the connection terminal 14d to the mold frame 14b will be explained with reference to FIG. 4. First, a metallic sheet is press-punched to provide a punched member having the connection plate 14c and the connection terminal 14d formed integrally. An insulating material such as a synthetic resin is molded with the punched member to obtain the mold frame 14b. Finally, unnecessary portions other than the connection plate 14c and the connection terminal 14d are removed, completing the synthetic resin mold frame 14b to which the connection plate 14c and the connection terminal 14d are suitably embedded.

Figure 5A:
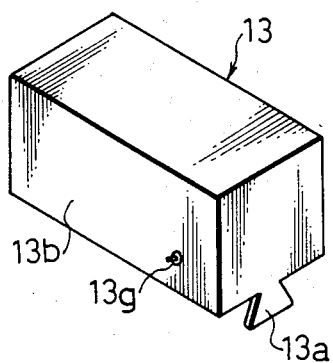
FIG. 5A is a perspective view of the metallic case of the high frequency resonance circuit block.
Figure 5B:
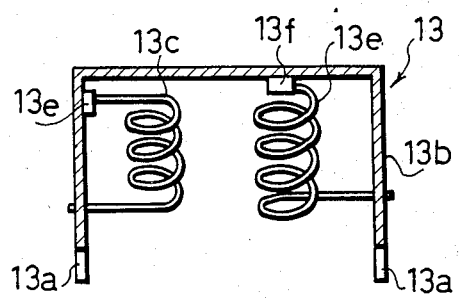
FIG. 5B is a sectional view of FIG. 5A.

The definite construction of each high frequency circuit block will be now explained. FIGS. 5A and 5B are schematic views of the high frequency resonance circuit block 13, in which 5A is a perspective view of the metallic case 13b and 5B is a sectional view. In the drawings, reference numerals 13e and 13f represent fixing members for fixing the end portions of the helical coils 13c, 13c to the metallic case 13b. Reference numeral 13g represents a small hole bored on the side wall of the case 13. This hole 13g is used for inserting and fixing the end portion of each helical coil 13c. The helical coils 13c, 13c fixed inside the metallic case 13b in this manner are electromagnetically coupled with each other in so-called "M" coupling and together form the high frequency resonance circuit.

Figure 7:
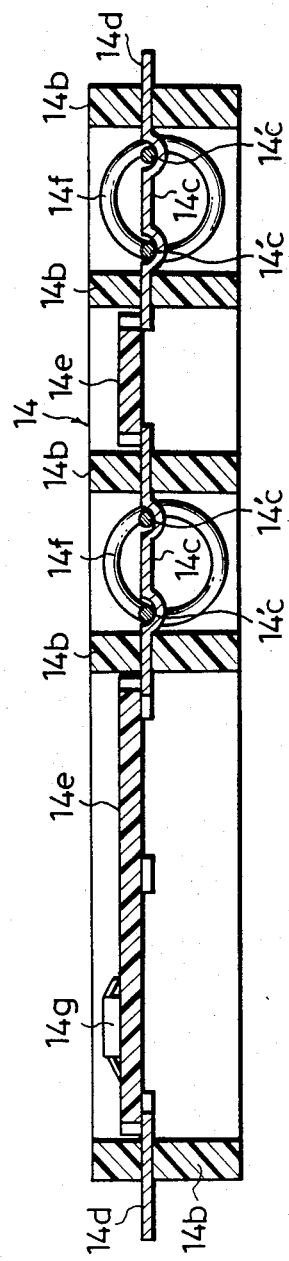
FIG. 7 is a sectional view taken along line B-B' of FIG. 6.
Figure 9:
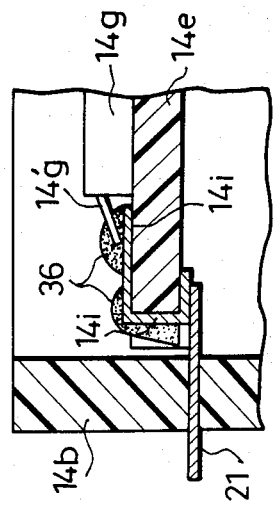
FIG. 9 is an enlarged sectional view of the principal portions.
Figure 8:
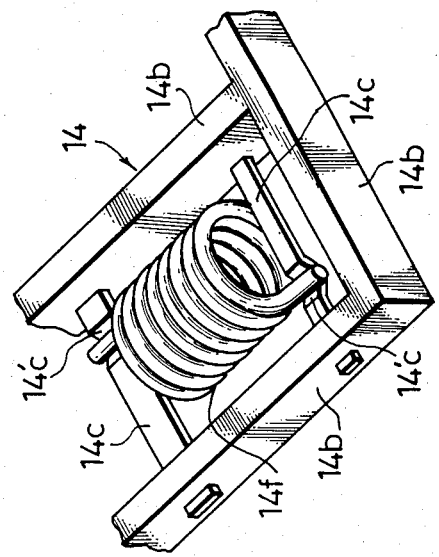
FIG. 8 is a perspective view which shows the state in which the coil is placed on the mold frame.

FIGS. 6 through 9 diagrammatically explain the high frequency circuit block 14 with FIG. 6 being a plan view, FIG. 7 a sectional view taken along line B-B' of FIG. 6, FIG. 8 a perspective view of the principal portions and FIG. 9 an enlarged sectional view of the principal portions. FIG. 6 shows the state in which the electric components are placed on the mold frame 14b but are not yet soldered. In the drawing, both ends of the coil 14f having an air care are placed on the connection plates 14c. Each coil can be stably held in place if a recess 14c' is formed at a suitable position of the connection plate 14c, on which the terminal of the coil 14f is placed, as shown in FIGS. 7 and 8. Various high frequency circuit components 14g such as transistors, resistors and the like are mounted to the printed circuit board 14e formed by printing a predetermined wiring pattern on a ceramic sheet or the like. Semi-spherical notches 14h are formed around the peripheral portion of each printed circuit board 14e and a metallic film is deposited so as to cover the notches and to complete the fitting terminals 14i (FIG. 9). The fitting terminals 14i are electrically connected to the printed pattern formed on each printed circuit board 14e.

Figure 10:
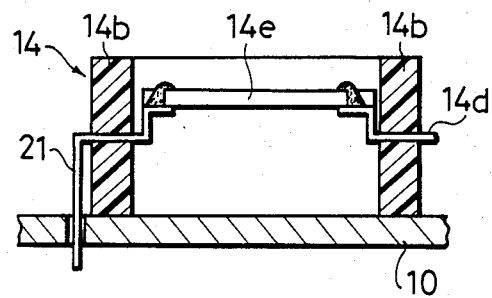
FIG. 10 is a sectional view which is useful for explaining the fitting of the printed circuit board.

FIG. 10 is a schematic view which is useful for explaining the fitting state of the printed circuit board. The printed circuit board 14e is placed on the connection terminal 14d and the ground terminal 21 that are emedded in the mold frame 14b of the high frequency circuit block 14, and the connection terminal 14d and the ground terminal 21 are soldered to the fitting terminals 14i of the printed circuit board 14e, thus fitting the printed circuit board 14e to the mold frame 14b.

Figure 11:
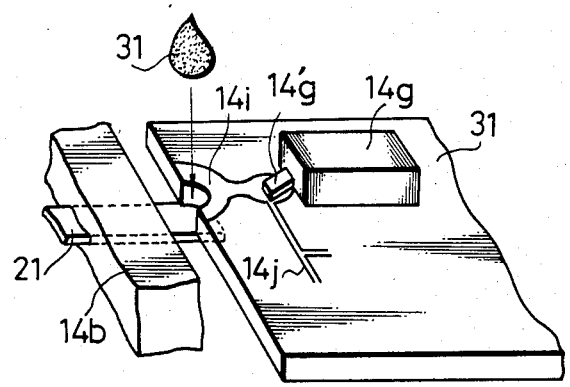
FIGS. 11 and 12 are schematic views which are useful for explaining the fitting of the circuit board or the like to the mold frame.
Figure 12:
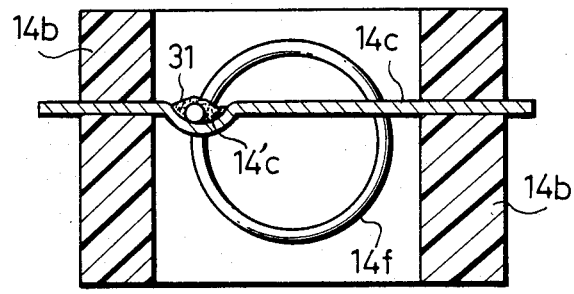

Next, fitting of the components to the printed circuit board 14e and fitting of the printed circuit board 14e and coil 14f to the mold frame 14b will be explained in detail. FIGS. 11 and 12 are schematic views useful for explaining the fitting of these components. First, formed by shown in FIG. 11, solder 31 as a mixture of a paste and solder powder is applied dropwise to the fitting terminals 14i and to the contact portions between the terminals 14g' of the high frequency circuit components 14g and the wiring pattern 14j. After these procedures, the state such as shown in FIG. 9 is reached. On the other hand, the solder 31 is also applied dropwise to the terminal portion of each coil 14f as shown in FIG. 12 and to the connection portions between the high frequency circuit blocks. Thereafter, the assembly to which the solder has thus been applied is heated inside an electric oven and is then cooled to solidify the solder, whereupon each high frequency circuit block 14 having its components fixed to the mold frame 14b is completed. At the same time, the electric connection between the high frequency circuit blocks is also completed. Each high frequency circuit block is then fitted to the bottom plate. After the electric connection between the high frequency circuit blocks is completed, the caulking pawl 11a of the frame 11 (shown in FIG. 2) and the caulking pawl 12a of the shield plate 12 are fitted into and caulked to the holes 10a of the bottom plate 10, thus completing the high frequency circuit apparatus.

In summary, the high frequency circuit apparatus in accordance with the present invention can be assembled by the following steps:

(a) The caulking pawls 14a–18a formed on the mold frames 14b–18b are fitted into and caulked to the holes 10d–10g of the bottom plate 10 to serve as the metallic chassis, thus fitting the mold frames 14b–18b of the high frequency circuit blocks to the bottom plate.

(b) The high frequency circuit components such as the printed circuit board 14e, the coil 14f and the like are placed on the mold frame.

(c) Before or after the step (a), the caulking pawl 13a of the high frequency resonance circuit block 13 consisting of the metallic case 13b and the helical coil 13c stored in the former 13b is fitted into and caulked to the hole 10c of the bottom plate 10 in such a manner that the open surface of the circuit block 13 is sealed by the bottom plate 10. Thus, the high frequency resonance block is fitted to the bottom plate 10.

(d) Solder is applied dropwise to the predetermined connection portions.

(e) The solder is then heated and fused inside an electric oven to fix the electric components placed on the mold frame of each high frequency circuit block and to establish electric connection between the high frequency circuit blocks.

(f) Finally, the caulking pawl 11a of the frame 11 to serve as the shield case is fitted into and caulked to the hole 10a of the bottom plate 10.

After the high frequency circuit apparatus is thus assembled, the high frequency circuit blocks are partitioned by the shield plates 12 of the frame 11 as shown in FIG. 3 and are electrically shielded from one another. The high frequency resonance circuit block 13 is double shielded from the other high frequency circuit blocks by its metallic case 13b and by the frame 11.

As described in the foregoing, the present invention fits the various high frequency circuit blocks to the sheet-like bottom plate and makes it possible to electrically connect the high frequency circuit blocks with one another and the components of each high frequency circuit block with one another under such a state. Accordingly, the connection work becomes extremely simple.

The present invention does not use any screws as the connection member and places the helical coil in the metallic case. Since the coil assembly thus obtained is fitted to the bottom plate as one block, the electric connection between the blocks can be made by use of reflow solder and the connection work can be automated.

In accordance with the present invention, further, the helical coil is incorporated in the metallic case as one block, the resulting block is fitted to the bottom plate and the frame is then fitted to the bottom plate so that the metallic case is electrically shielded from the other high frequency circuits. This arrangement double shields the high frequency circuit inside the metallic case from the other high frequency circuits and prevents its unstable operation.

The helical coil can be adjusted before it is assembled to the bottom plate. Hence, the adjustment can be easily made.

Each high frequency circuit block is formed on the mold frame to constitute the high frequency circuit block. This arrangement makes it possible to replace the block as a whole when a trouble occurs. Hence, maintenance and repair can be easily made.

What is claimed is:

1. An assembly structure for a high frequency circuit apparatus including:
   at least one first high frequency circuit block;
   a metallic chassis on which said first high frequency circuit block is disposed;

a second high frequency circuit block formed by placing a high frequency circuit element inside a metallic case having one of its surfaces opened;

means formed integrally with said first high frequency circuit block for connecting it electrically with another high frequency circuit block; and a shield case having one of its surfaces opened and divided into compartments by shield plates shielding said high frequency circuit blocks from one another;

said second high frequency circuit block being fitted to said metallic chassis in such a fashion that the open surface thereof is sealed by said metallic chassis;

said shield case being fitted to said metallic chassis in such a fashion that said compartments thereof separate said high frequency circuit blocks from one another.

2. The assembly structure of a high frequency circuit apparatus as defined in claim 1 wherein said high frequency circuit element inside said second high frequency circuit block is a helical coil.

3. The assembly structure of a high frequency circuit apparatus as defined in claim 2 wherein said high frequency circuit inside said metallic case is double shielded from other high frequency circuits.

4. The assembly structure of a high frequency circuit apparatus as define in claim 1 wherein said first frequency circuit block is formed by fitting a printed circuit board, a coil and other electric components to a mold frame.

5. An assembly for housing a high-frequency circuit including a plurality of discrete circuits shielded from one another and yet connected electrically together; including a metallic chassis adapted to support each of said discrete circuits;

one of said discrete circuits including a metallic case adapted to be secured to said chassis and having at least one high-frequency component secured integrally therein; and means extending externally of said case for providing electrical connection to said high-frequency component;

at least one other of said discrete circuits including a frame molded of an insulative material and having terminal portions embedded therein to extend externally of said frame, said frame supporting a plurality of electric components connected electrically together;

means for connecting said discrete circuits electrically together; and a metallic shielding case having a plurality of compartments each adapted to contain a respective discrete component, said shielding case being adapted to be secured to said chassis for providing a plurality of shielded compartments for each of said discrete components.

6. An assembly according to claim 5, said terminal portions of said frame each lying along said chassis in proximity to at least one other terminal portion and said sheilding case being formed of a top wall portion and a plurality of depending wall portions formed integrally therewith and adapted to extend in spaced relation to said chassis to enable said terminal portions to fit thereunder.

7. An assembly according to claim 6, said frames each having conductive portions molded therein for supporting respective electric components, and said electric components being fixed to said conductive portions and said terminal portions being fixed to one another by droplets of solder being applied thereto and thereafter fused by heating said assembly.

* * * * *